(12) United States Patent
Hofstee et al.

(10) Patent No.: US 6,507,115 B2
(45) Date of Patent: Jan. 14, 2003

(54) MULTI-CHIP INTEGRATED CIRCUIT MODULE

(75) Inventors: Harm Peter Hofstee, Austin, TX (US); Robert Kevin Montoye, Austin, TX (US); Edmund Juris Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/736,584

(22) Filed: Dec. 14, 2000

(65) Prior Publication Data

US 2002/0074668 A1 Jun. 20, 2002

(51) Int. Cl.[7] .................... H01L 23/48; H01L 23/52; H01L 29/40
(52) U.S. Cl. ............... 257/777; 257/686; 257/685; 257/778; 361/760; 438/108; 438/109
(58) Field of Search .................... 257/695, 685, 257/777, 778, 706, 718, 719, 720, 796, 686, 712, 786, 737, 738; 361/760; 438/108, 109, 612, 613

(56) References Cited

U.S. PATENT DOCUMENTS

| 5,646,828 A | * | 7/1997 | Degani et al. | 361/715 |
| 5,719,438 A | * | 2/1998 | Beilstein, Jr. et al. | 257/686 |
| 5,821,762 A | * | 10/1998 | Hamaguchi et al. | 324/754 |
| 5,977,640 A | * | 11/1999 | Bertin et al. | 257/777 |
| 6,100,593 A | * | 8/2000 | Yu et al. | 257/777 |
| 6,143,590 A | * | 11/2000 | Ohki et al. | 438/122 |
| 6,229,216 B1 | * | 5/2001 | Ma et al. | 257/777 |
| 2001/0028105 A1 | * | 10/2001 | Hashimoto et al. | |

FOREIGN PATENT DOCUMENTS

JP 04179264 A * 6/1992

* cited by examiner

*Primary Examiner*—Eddie Lee
*Assistant Examiner*—Chris Chu
(74) *Attorney, Agent, or Firm*—Joseph P. Lally; Casimer K. Salys

(57) ABSTRACT

A multi-chip module is disclosed in which a first die connects to a second set of die via a set of C4 connections within a single package. Low resistivity signal posts are provided within the lateral separation between adjacent die in the second set of die. These signal posts are connectable to externally supplied power signals. The power signals provided to the signals posts are routed to circuits within the second set of die over relatively short metallization interconnects. The signal posts may be connected to thermally conductive via elements and the package may include heat spreaders on upper and lower package surfaces. The first die may comprise a DRAM while the second set of die comprise portions of a general purpose microprocessor. The power signals provided to the second set of die may be connected to a capacitor terminal in the first die to provide power signal decoupling.

22 Claims, 3 Drawing Sheets

MULTI-CHIP INTEGRATED CIRCUIT MODULE

BACKGROUND

1. Field of the Present Invention

The present invention generally relates to the field of semiconductor devices and more particularly to a multi-chip module in which power supply degradation is minimized by reducing the length of the metallization layer interconnects required to provide power to the device circuits.

2. History of Related Art

Semiconductor manufacturers have developed single and multi-chip modules (SCMs and MCMs) to provide efficient packages for housing semiconductor devices having a large number of connections. In a chip stack MCM, two or more devices or die are stacked on top of each other and enclosed within a single plastic oF ceramic package. A processor chip, for example, may be stacked on top of a memory chip. Depending upon the implementation, MCM packaging permits a large number of die-to-die interconnections.

In a conventional stacked MCM implementation, the backside of a first die is attached to the active surface of a second die, where the active surface refers to the surface into which transistors and other active devices are fabricated and on top of which metallization layers are produce. A stacked MCM implementation requires some form of wire bond for die-to-die or inter-die connections to make the physical connection from the active surface of the first die to the active surface of the second die. Because wire bonding requires a minimum pad size to achieve adequate reliability, the stacked MCM design places a limit on the number of die-to-die connections possible.

A flip chip MCM design, in which the active surfaces of the first and second die are in contact with each other, greatly increases the number of die to die connections possible by permitting 4C connections to each other. Referring to FIG 1, a flip chip MCM 100 is depicted. In the depicted embodiment, MCM 100 includes a first die 104 and a second die 106 enclosed within a plastic or ceramic package 102. The active surface 105 of first die 104 faces the active surface 107 of second die 106 to enable, die-to-die connections between the die pair via a plurality of controlled collapse chip connections (C4) identified in FIG. 1 by reference numeral 108. External connections to the die pair with a conventional bond pad attach in which a wire 112 connects a bond pad 110 of second die 106 with a lead frame 114. The lead frame is connected to an external conductive element such as the ball grid array 116 depicted.

Those familiar with electronic devices in general will appreciate that the circuits of die 104 and 106 require externally supplied power. Because of the physical arrangement of the die in the flip chip stack as illustrated in FIG. 1, externally supplied signals must attach to the periphery of one of the die. Thus, a circuit 111 that is physically located at or near the center of the die must be connected to the externally supplied power signals (i.e., VDD and ground) via a relatively long metallization interconnect 113. It will be further appreciated by those familiar with semiconductor device electronics that the capacitance and resistivity of the metallization interconnects may result in a significant amount of power supply degradation. This is especially true for high-speed devices (i.e., devices operating in excess of 1 GHz). Thus, although the flip chip stack beneficially enables a large number of die-to-die interconnections, the physical arrangement of the die results in a peripherally powered device that may required a large number of long metallization interconnects. The power dissipated in the interconnections can be a limiting factor in the achievable performance of a give design. Thus, it would be desirable implement a multi-chip module that enabled a large number of die-to-die interconnections without that eliminated the long metallization interconnects characteristic of peripherally powered designs.

SUMMARY OF THE INVENTION

The problems identified above are in large part addressed by a multi-chip device or module in which a first die is stacked in contact with a second set of die. The die are stacked in a flip chip arrangement in which the active surface of the first die is in close proximity to the active surfaces of each of the second set of die. Die-to-die connections are made using C4connections. The second set of die are laterally displaced from each other. A set of low resistivity signal posts are provided within the lateral separation between adjacent die in the second set of die. These signal posts are connected to externally supplied power signals such as VDD and ground. The power signals are then routed to the circuits within the second set of die over relatively short metallization interconnects. In one embodiment, the multi-chip module includes a ceramic or plastic package that en closed the first and second set of die. The package may further include thermally conductive elements or heat spreaders on each of the surfaces of the package. External connections may be made to the module through a set of BGA elements that are positioned around the perimeter of t he module. In one embodiment, the BGA elements of the module may be attached to a circuit board over an aperture in the circuit board to provide the ability to attach a heat sink to each of the heat spreaders. In one embodiment, the first die and the second set of die are fabricated with differing technologies where one of the technologies is suitable for fabricating capacitive elements. The first die may comprise a DRAM device while the second set of die comprise portions of a general-purpose microprocessor. In this embodiment, the power signals of the second set of die are connected through one of the capacitor terminals in the first die to provide decoupling of the power signal that is provided to the second set of die.

BRIEF DESCRIPTION OF THE DRAWINGS

Other objects and advantages of the invention will become apparent upon reading the following detailed description and upon reference to the accompanying drawings in which.

Figure 1:
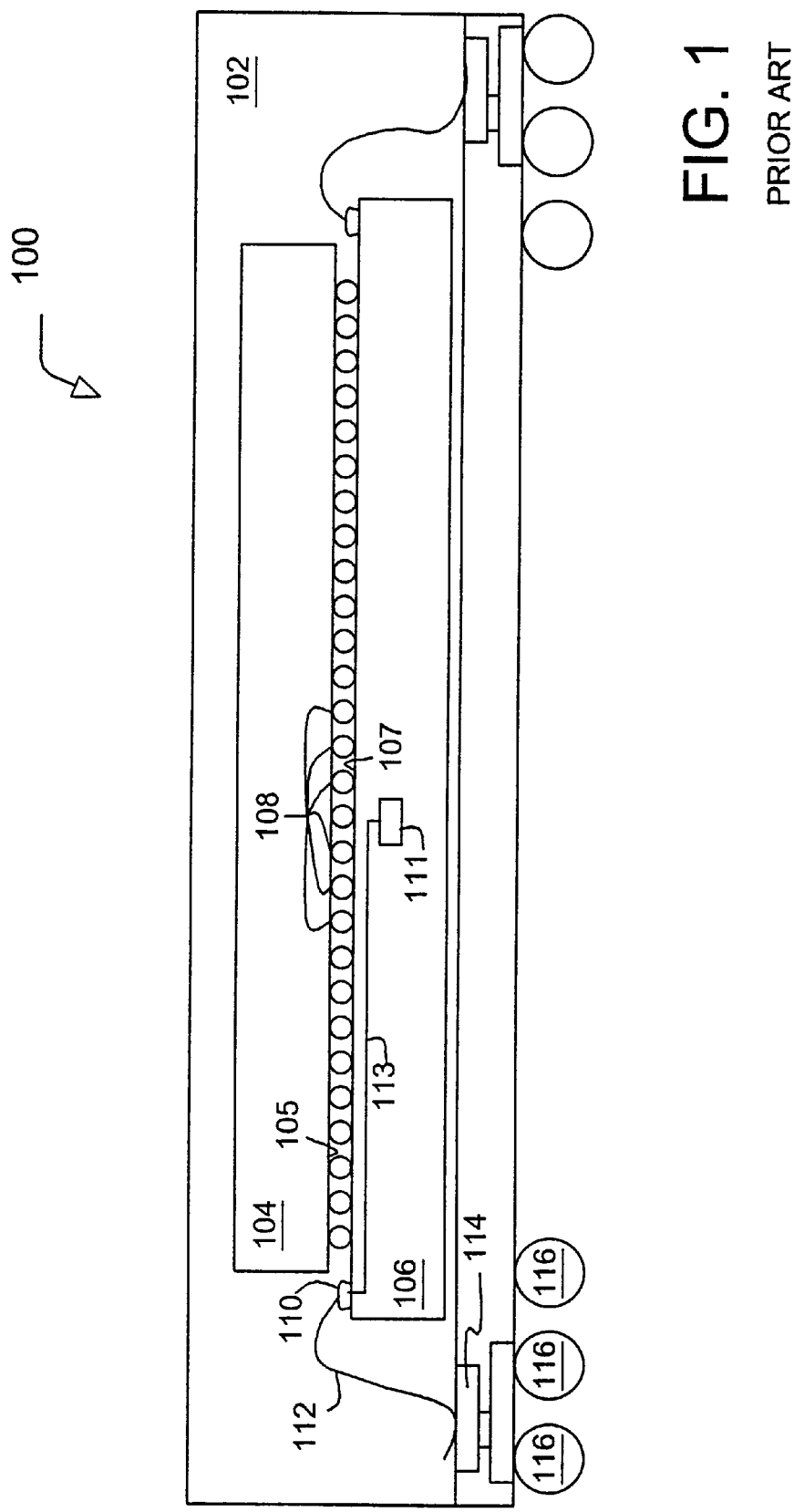
FIG. 1 is a diagram of a flip-chip stack according to the prior art.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Figure 2:
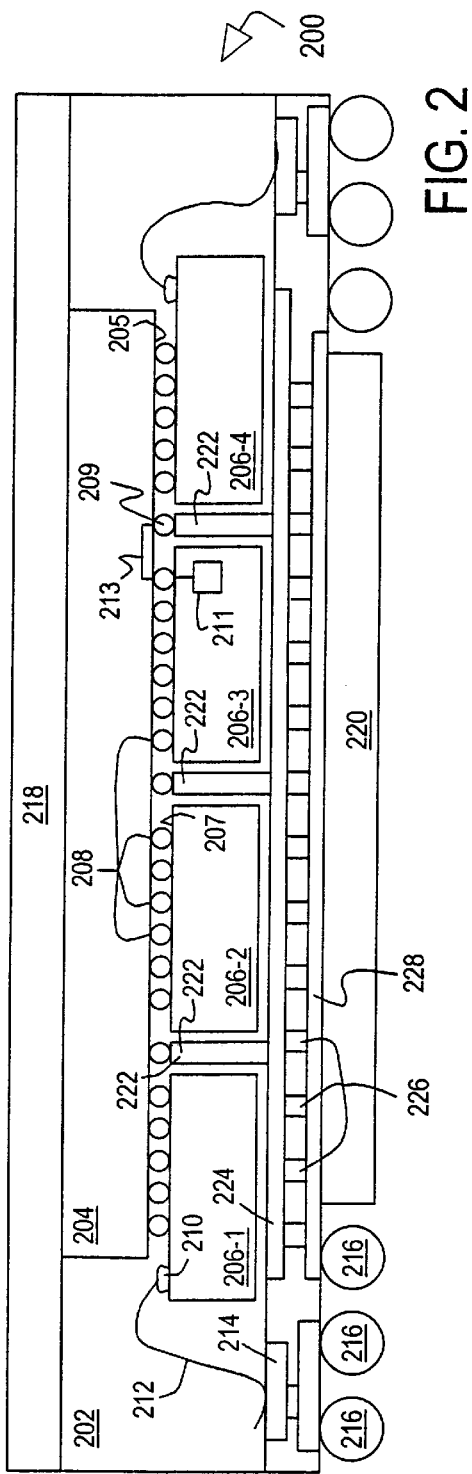
FIG. 2 is a cross sectional view of a flip-chip stack according to one embodiment of the present invention.

Turning now to the drawings, FIG. 2 is a cross-sectional view of a flip chip stack module 200 according to one embodiment of the present invention. In the depicted embodiment, a first device or die 204 and a second set of devices or die 206-1, 206-2, 206-3, and 206-4 (generically or collectively referred herein to as die 206 where "die" is used for both the singular and plural according to industry custom) are enclosed in a package 202 preferably comprised of a plastic or ceramic material. An active surface 205 of first die 204 faces the active surfaces 207 of each of the second set of die 206. Connections between first die 204 and the second set of die 206 are made via a set of C4 structures 208. C4 technology is suitable for interconnecting high I/O (input/output) count and area array solder bumps on the silicon chips to a base chip carriers and for making die-to-die connections in a flip-chip stack arrangement. See, e.g., Miller, U.S. Pat. Nos. 3,401,126 and 3,429,040 assigned to the assignee of the present application, for a further discussion of C4 techniques.

In one embodiment, the first die 204 may comprise a storage element or memory device such as a dynamic RAM and the second set, of die 206 may comprises various portions of a single functional unit such as a microprocessor. If, for example, the single functional unit that is embodied in the set of die 206 is a symmetric multi-processor (SMP), the device is typically amenable to the physical division of its various components. In the case in which the second set of die 206 comprise an SMP device, for example, each of the second set of die 206 may comprise one of the processors. In other embodiments, the second set of die 206 may include the various execution elements of a superscalar microprocessor or may include one or more digital signals processors or other suitable logic elements. Whereas the various elements represented by each of the set of die 206 are typically implemented on a single die, the present invention contemplates separating functional components of the device and fabricating each of them on its own substrate.

By fabricating the second set of die 206 on distinct substrates, flip chip stack 200 permits a physical displacement or separation between adjacent die. The physical separation of second set of die 206 beneficially reduces the maximum distance between any circuit internal to one of the second set of die and the perimeter of the die in which the circuit is located. In the depicted embodiment, externally supplied power supply signals are connectable to signal posts 222 located between adjacent pairs of the second set of die 206 (i.e., between die 206-1 and 206-2, between die 206-2 and 206-3, and between 206-3 and 206-4). Each signal post 222 may be connected at one end directly to a C4 contact 209 on the active surface of first die 204. The contact 209 is connected to a power supply interconnect 213 of the first die 204 via a C4 or other suitable connection. The power supply interconnect 213 may be further connected to a circuit 211 within one of the second die 206 that is adjacent to the corresponding signal post 222. In this manner, power supply signals are delivered to each circuit 211 in the second set of die 206 via a signal post 222 that is adjacent to the die thereby reducing the length of the metallization interconnect from the circuit to the power supply signal.

Each signal post 222 is preferably comprised of a thermally conductive cylinder typically comprised of copper, aluminum, or other suitable metal. Whereas the metallization interconnects in first die 204 and the second set of die 206 typically have a minimum dimension in the range of approximately one micron, the diameter of signal posts 222 is typically exceeds 100 to 1000 microns such that the resistivity of signal posts 222 is significantly less than the resistivity of any metallization interconnection in first die 204 and second die 206.

In the depicted embodiment, thermally conductive elements 224 and 228 provide means for conducting heat laterally in module 200 while vertical thermally conductive elements 226 conduct heat vertically. Each lateral element 224 and 228 may be implemented as a metal sheet comprised of copper or aluminum. Signal posts 222 may be connected to external pins or ball grid array (BGA) elements 216 through lateral elements 224 and 228. Each vertical conductive element (thermal via) 226 may include a via formed in package 202 that is filled with a thermally conductive paste. A thermal paste comprised of conductive filler particles and polymer resins suitable for use in thermal vias 226 is disclosed in Kang, Thermally Conducting Materials and Applications for Microelectronic Packaging,: U.S. Pat. No. 6,114,413, assigned to IBM Corporation and incorporated by reference herein. Alternatively, thermal vias 226 may be electroplated, filled with a reflowed solder paste, or filled with a thermally conductive but electrically insulating material such as a thermally enhanced dielectric. See, e.g., Beilstein, Thermally Enhanced Semiconductor Chip Package, U.S. Pat. No. 5,309,318, also assigned to IBM Corporation and incorporated by reference herein.

In one embodiment, the BGA elements 216 are located at the perimeter of a lower surface of package 202. The flip chip module 200 depicted in FIG. 2 further includes heat spreaders 218 and 220, which are attached to the upper and lower surfaces of package 202. The lower heat spreader 220 may be positioned within the perimeter of BGA elements 216 such that the BGA elements 216 surround heat spreader 220. Heat spreaders 218 and 220 improve the ability of module 200 to dissipate heat and are typically comprised of a suitable thermal conductor such as copper or aluminum. Flip chip stack module 200 may further include conventional wire bond elements 212 that connect a bond pad 210 to a lead frame 214 and BGA 216.

Figure 3:
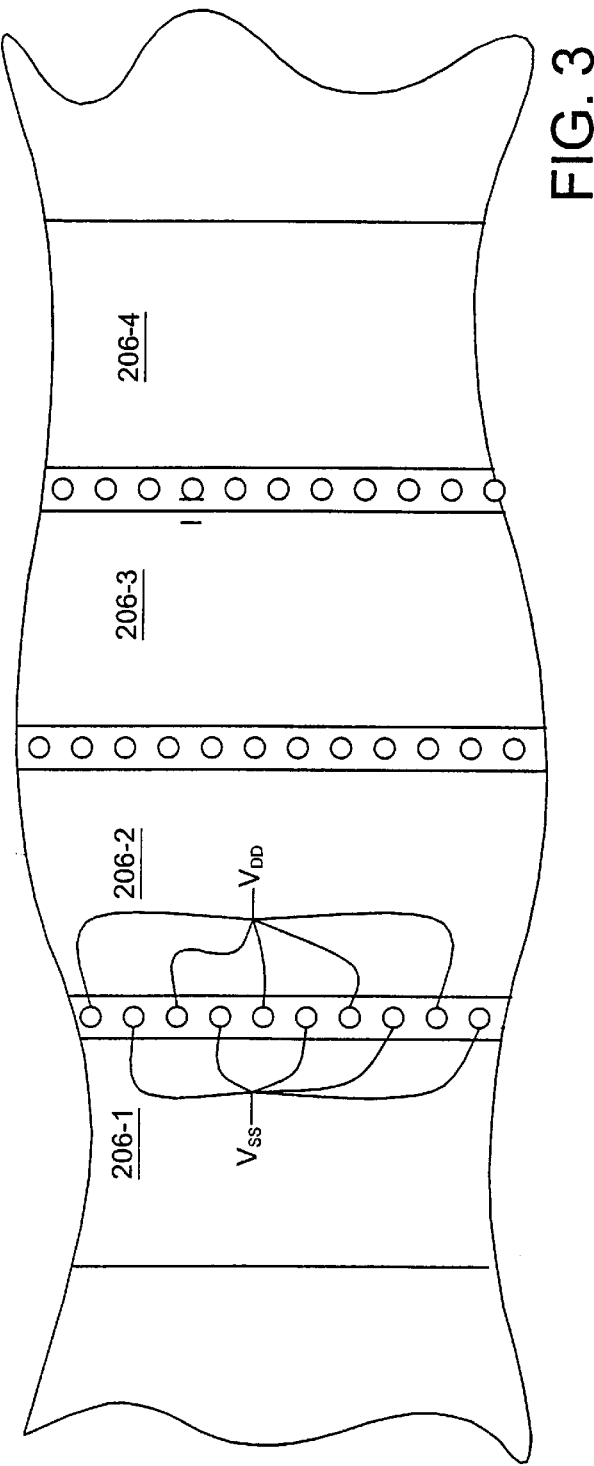
FIG. 3 is a top view of the flip chip stack of FIG. 2 illustrating a possible arrangement of externally supplied power signals.

Referring to FIG. 3, a top sectional view of flip chip stack module 200 illustrates an embodiment in which a set of signal posts 222 is provided between each of the set of die 206. In the depicted embodiment, the externally supplied power signals include a VDD signal and a ground signal. In this embodiment, the external VDD signal and ground signal may be provided to alternating signal posts 222. By providing a plurality of signal posts intermediate between each of the second set of die 206, the flip chip stack design illustrated is able to use C4 connections to achieve a high I/O count between first die 204 and the second set of die 206 while improving the proximity between circuits in second set of die 206 and externally supplied power signals. By improving the proximity to the die's power signals, the invention improves achievable performance by reducing the average length of metallization interconnects that provide power signals to the internal circuits of the set of die 206. Although the illustration depicts an embodiment that includes an alternating arrangement of a pair of power signals, other embodiments may utilize more than two power signals and may include an alternative pattern of power signals posts 222.

Figure 4:
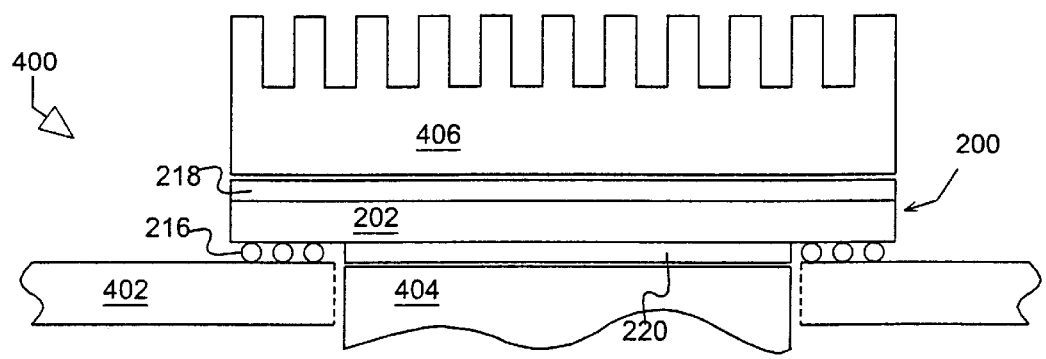
FIG. 4 is a system including flip chip stack according to one embodiment of the device installed on a printed circuit board.

Turning now to FIG. 4, an electronic assembly or system 400 is depicted that includes the use of a flip chip stack MCM such as the module 200 depicted and described above. In the depicted embodiment, assembly 400 includes a flip chip stack module 200 including a package 202 and a pair of heat spreaders 218 and 220. The BGA elements 216 form a peripheral array at the bottom of package 202 that surrounds the heat spreader 220. The BGA elements 216 are connectable to a peripherally arranged set of elements on a circuit board 402. The circuit board 402 includes a substantially rectangularly shaped aperture. When the module 200 is affixed to circuit board 402 with the BGA elements 216 in contact with corresponding elements of board 202, the heat spreader 220 substantially covers the aperture in circuit board 402. In the depicted embodiment, additional thermal conductivity is provided by the inclusion of a first heat sink 404 that is placed in contact with or in close proximity to the heat spreader 220 and by the inclusion of a second heat sink 406 in contact with or in close proximity to the heat spreader 218. Each heat sink is typically comprised of aluminum, copper, or another suitable thermally conductive material and may include a set of fins extending from a base piece.

Figure 5:
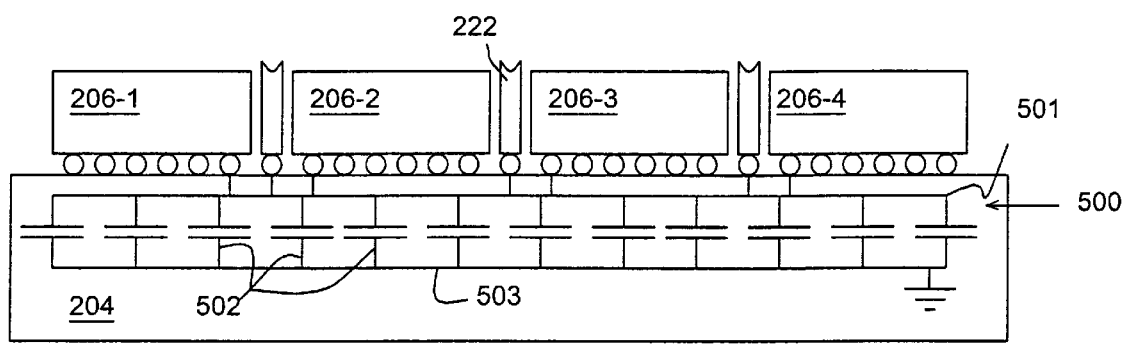
FIG. 5 is a representational view of an embodiment of the invention in which capacitive elements in one of the die are used to provide decoupling for the other die.

Turning now to FIG. 5, a representational diagram of an embodiment of the present invention is depicted in which first die 204 and the second set of die 206 are fabricated with differing semiconductor technologies. Typically, integrated circuits are fabricated according to a particular technology or process that is optimized to produce device types of a specific class. Bipolar and MOS are examples of two broad classes of technologies. In the embodiment illustrated in FIG. 5, the technology associated with the fabrication of first die 204 is suitable for fabricating a large number of capacitive elements. In one embodiment, for example, first die 204 is a DRAM. DRAM technology requires the ability to fabricate tiny capacitors that are used as the basic storage element of the device. The second set of die 206 may comprise various portions of a general purpose or special purpose microprocessor. In this embodiment, the technology of second set of die 206 is typically not optimized for producing capacitors as part of the process. Although large, parallel plate capacitors could be fabricated using essentially any semiconductor technology that includes the formation of a dielectric material, these capacitors are not typically cost effective (i.e., the area required to obtain a capacitor with a specified capacitance is much greater than the area required of a capacitor fabricated with the technology of first die 204). In the embodiment where first die 204 is a DRAM, for example, the first die technology typically includes a process sequence optimized for producing capacitors that do not consume a large area of the die. The DRAM process may include, as an example, a process sequence optimized for the production of trench capacitors.

In the embodiment depicted in FIG. 5, the second set of die 206 takes advantage of the first die technology to provide a decoupling capacitor that may further enhance the performance characteristics of module 200. More specifically, the power signal posts 222 of module 200 are connected to a first terminal 501 of a capacitor 500 within first die 204. The capacitor 500 may include a set of individual capacitor elements 502 that are connected in parallel to form a larger capacitor. The second terminal 503 of capacitor 500 is typically grounded. It will be appreciated by those familiar with circuit design that the voltage of first terminal 501 of capacitor 500 is stabilized against transient swings. This stabilized voltage may then be used to supply power to the second set of die 206. In the depicted embodiment, each of the second set of die 206 includes at least one die-to-die connection to first terminal 501 of the capacitor 500 in first die 204 via C4 connections 208. In this manner, the power that is supplied to each of the second set of die 206 is anchored by a large decoupling capacitor located in first die 204.

It will be apparent to those skilled in the art having the benefit of this disclosure that the present invention contemplates a multi-chip module that is optimized for reduced power degradation by the inclusion of low resistivity elements that carry power signals to within a close proximity of the circuits thereby minimizing the distance over which the power signals must routed through metallization interconnects. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A multi-chip module comprising:
    a first semiconductor die having an active surface;
    a second set of semiconductor die, wherein active surfaces of each of the second set of devices are oriented to face the active surface of the first device; and
    signal posts located between each adjacent pair of the second set of semiconductor die, wherein first ends of the signals posts are connectable to an external power supply signal and wherein second ends of the signal posts are connected directly to power supply contacts on the active surface of the first semiconductor die and further connected through a power supply interconnect in the first semiconductor die to power supply contacts on the second semiconductor die such that the signal posts provide power to the first and second die when the signal posts are connected to the power supply signal.

2. The module of claim 1, wherein the first die comprises a memory device and the second set of die collectively comprise a processor device.

3. The module of claim 1, further comprising a perimeter of ball grid array structures surrounding a heat spreader attached to a package enclosing the first die and the second set of die.

4. The module of claim 3, further comprising a second heat spreader attached to an upper surface of the package.

5. The module of claim 1, wherein any adjacent pair of the signal posts include a first signal post connected to a ground contact of the first die and a second signal post connected to a VDD contact of the first die.

6. The module of claim 1, wherein the first ends of the signal posts are electrically connected to a pair of laterally oriented and thermally conductive elements and a set of vertically oriented thermal vias defined by voids in a module package filled with a thermally conductive paste.

7. The module of claim 1, wherein the second end of at least one of the signal posts is connected to a a VDD contact of the first die and a first terminal of a decoupling capacitor in the first die.

8. An assembly comprising:
    a printed circuit board, wherein the circuit board defines an aperture;
    a multi-chip module attached to the circuit board positioned above the aperture in the circuit board, wherein the module includes a first semiconductor die enclosed within a package, a second set of semiconductor die enclosed with the package, wherein an active surface of each of the second set of die is in close proximity to an active surface of the first die, and signal posts located between each adjacent pair of the second set of die, wherein the signals posts are connectable at a first end to an external power supply signal and connected at a second end directly to power supply contacts on the active surface of the first semiconductor die and further connected through a power supply interconnect in the first semiconductor die to the second semiconductor die such that the signal posts provide power to the first and second die when the signal posts are connected to the power supply signal;

a first heat sink located above the circuit board in close proximity to an upper surface of the module; and a second heat sink in close proximity to a lower surface of the module and extending through the circuit board aperture.

9. The assembly of claim 8, wherein the first die comprises a memory device and the second set of die collectively comprise a processor device.

10. The assembly of claim 8, wherein a bottom surface of the module includes a perimeter of ball grid array structures surrounding a heat spreader.

11. The assembly of claim 10, further comprising a heat spreader attached to an upper surface of the module.

12. The assembly of claim 8, wherein any adjacent pair of the signal posts include a first signal post connectable to ground and a second signal post connectable to a VDD power supply signal.

13. The assembly of claim 8, wherein the signal posts are connected to thermal via elements of the module.

14. The assembly of claim 8, wherein at least one of the signal posts is connected to a capacitive structure in the first die.

15. A data processing system comprising:

a memory die having an active surface;

a set of die that collectively comprise a microprocessor device, each of the set of microprocessor die having an active surface arranged in close proximity to the active surface of the memory die, and. wherein each of the microprocessor die is connected to the memory die via a plurality of controlled collapse chip connections; and a set of signal posts positioned between each adjacent pair of the processor die, wherein the signal posts are connected at a first end to an external power supply and connected at a second end to power supply contacts on the active surface of the memory die and further connected through a power supply interconnect in the memory die to the at least one of the processor die.

16. The system of claim 15, wherein the memory die comprises a dynamic memory.

17. The system of claim 16, wherein the memory die includes a decoupling capacitor structure and wherein the signal posts are connected to a terminal of the capacitor.

18. The system of claim 15, wherein the power supply interconnect is connected to one of the processor die via a C4 connection.

19. The system of claim 15, wherein a bottom surface of a module enclosing the memory die and the set of processor die includes a perimeter of ball grid array structures surrounding a heat spreader.

20. The system of claim 19, further comprising a second heat spreader attached to an upper surface of the memory die.

21. The system of claim 15, wherein any adjacent pair of the signal posts include a first signal post connected to ground and a second signal post connected to a VDD power supply signal.

22. The system of claim 15, wherein the signal posts are connected to a pair of laterally oriented thermal via elements and a set of vertically oriented thermal vias defined by voids in a module package filled with a thermally conductive paste.

* * * * *